United States Patent
Ochiai

(10) Patent No.: US 7,450,355 B2
(45) Date of Patent: Nov. 11, 2008

(54) POWER SUPPLY APPARATUS WITH FUNCTION OF DETECTING ABNORMALITY OF CURRENT SENSOR

(75) Inventor: Kiyoe Ochiai, Nagoya (JP)

(73) Assignee: Toyota Jidosha Kabushiki Kaisha, Toyota (JP)

( * ) Notice: Subject to any disclaimer, the term of this patent is extended or adjusted under 35 U.S.C. 154(b) by 13 days.

(21) Appl. No.: 11/660,675

(22) PCT Filed: Mar. 9, 2006

(86) PCT No.: PCT/JP2006/305199

§ 371 (c)(1),
(2), (4) Date: Feb. 21, 2007

(87) PCT Pub. No.: WO2006/100992

PCT Pub. Date: Sep. 28, 2006

(65) Prior Publication Data

US 2008/0094762 A1    Apr. 24, 2008

(30) Foreign Application Priority Data

Mar. 18, 2005    (JP)    ............................. 2005-079760

(51) Int. Cl.
*H02H 7/08*    (2006.01)
(52) U.S. Cl. ........................... 361/31; 361/23; 318/430; 318/434
(58) Field of Classification Search .................... 361/23, 361/24, 30, 31, 33; 318/430, 432, 434
See application file for complete search history.

(56) References Cited

U.S. PATENT DOCUMENTS

| 5,357,181 A | * | 10/1994 | Mutoh et al. ................. 318/139 |
| 6,593,714 B2 | * | 7/2003 | Nagayama ............. 318/400.07 |
| 6,914,408 B2 | * | 7/2005 | Sawada et al. .............. 318/727 |
| 7,091,684 B2 | * | 8/2006 | Kobayashi et al. .......... 318/432 |
| 7,372,686 B2 | * | 5/2008 | Ochiai ....................... 361/93.1 |
| 2002/0008492 A1 | | 1/2002 | Nagayama |

FOREIGN PATENT DOCUMENTS

| EP | 0 901 217 A1 | 3/1999 |
| JP | A 08-172721 | 7/1996 |

* cited by examiner

*Primary Examiner*—Paul Ip
(74) *Attorney, Agent, or Firm*—Oliff & Berridge, PLLC

(57) ABSTRACT

A current detector (60) samples a motor current (MCRT_A) from a controlling sensor and a motor current (MCRT_B) from a monitoring sensor, and holds respective motor current maximum values (MCRT_Amax, MCRT_Bmax) at each prescribed operation cycle. An abnormality determiner (62a) detects that the motor current maximum value (MCRT_Amax) is in GND short-circuiting range and that the current difference between the maximum values exceeds a prescribed threshold value at each of successive operation cycles, to thereby determine an abnormality of the controlling sensor. Then, the abnormality determiner (62a) generates a detect signal (DET) specifying the current sensor abnormality and outputs it to a relay driver (64) and an alarm (66). Relay driver (64) receives the detect signal (DET) and generates a signal (SE) to turn off a system relay. The alarm (66) generates a signal (AL) and outputs it to display means arranged outside a power supply apparatus.

15 Claims, 10 Drawing Sheets

POWER SUPPLY APPARATUS WITH FUNCTION OF DETECTING ABNORMALITY OF CURRENT SENSOR

TECHNICAL FIELD

The present invention relates to a power supply apparatus, and particularly to a power supply apparatus with a function of detecting an abnormality of a current sensor, which detects a current passing through a drive circuit incorporated in the power supply apparatus.

BACKGROUND ART

In recent years, hybrid vehicles and electric vehicles are receiving attention as environment-friendly vehicles. A hybrid vehicle includes as its motive power source, in addition to a conventional engine, a DC (Direct Current) power supply, an inverter, and a motor driven by the inverter. Specifically, the vehicle is powered by driving the engine, as well as by converting a DC voltage from the DC power supply into an AC (Alternating Current) voltage by the inverter so that the converted AC voltage is used to drive the motor.

An electric vehicle is powered by a DC power supply, and inverter and a motor driven by the inverter.

Generally, in such hybrid vehicle and electric vehicle, a motor current actually supplied from the inverter to the motor is detected using a current sensor, and control is exerted so that a current detect value output from the current sensor and a current specify value calculated from the required torque agrees with each other. In other words, what is called feedback control is exerted.

Herein, if a current sensor is abnormal, the current detect value output from the current sensor does not agree with the actual motor current. For example, it may be extremely smaller than the actual motor current. If the aforementioned feedback control is exerted in such a case, the actual motor current would be extremely greater than the desired current specify value. When this overcurrent passes through the inverter, a load corresponding to the magnitude of the current and the time during which the current passes is placed on the inverter, whereby the inverter may be damaged. Accordingly, in order to prevent the damage of the inverter, the abnormality of the current sensor must be detected quickly and surely.

For example, Japanese Patent Laying-Open No. 08-172721 discloses an apparatus for detecting an abnormality of a motor output system that can detect an abnormality of a system for outputting a current to a motor (hereinafter also referred to as motor current output system) so that the damage of peripheral equipment by overcurrent is prevented. Specifically, the apparatus for detecting an abnormality of a motor output system includes: a current sensor detecting an actual current passing through the motor and outputting the magnitude of the actual current as a current detect value; current compare means for constantly comparing a current specify value and the current detect value and outputting a deviation of the current detect value from the current specify value; abnormality determine means for determining that the motor current output system is abnormal when the state where the deviation being greater than a prescribed threshold value continues for at least a prescribed period; and abnormality process means for stopping the power supply to the motor when the abnormality is determined by the abnormality determine means.

With such a configuration, as the abnormality of the motor output system is determined when the state where the deviation being greater than a prescribed threshold value continues for at least a prescribed period, erroneous abnormality determination is prevented in such a case that the deviation temporarily increases due to the rise of the actual current delaying from the current specify value in a transient state or due to noises being mixed. Thus, the abnormality of the motor output system can accurately be detected and damage or the like of peripheral equipment due to supply of the overcurrent can be prevented.

However, with this conventional abnormality detecting apparatus, in consideration of preventing erroneous detection, lapse of a certain period is always necessary for determining an abnormality. When the motor current becomes an overcurrent when the motor output system is abnormal, the load placed on the inverter becomes considerably great proportionally to the certain period, and whereby the inverter may be damaged.

Further, according to the conventional abnormality detecting apparatus, when the current compare means outputs the deviation of the current detect value from the current specify value, an output waveform of the deviation between them is represented by a half wave as in FIG. 12, since the actual current and the current specify value are both sine waves inherently as shown in the figure. Thus, it cannot be compared with a prescribed threshold value in magnitude accurately. Therefore, the current compare means is configured to include a filter circuit, so that the deviation can be filtered to be converted into an output waveform represented by an alternating dot and dashed line in the figure. The converted deviation is compared with a prescribed threshold value to determine an abnormality.

On the other hand, with the current compare means with such a configuration, the outputted deviation delays by the time constant of the filter circuit. This increases the period required for determining an abnormality and the load to the inverter.

DISCLOSURE OF THE INVENTION

An object of the present invention is to provide a power supply apparatus that can detect an abnormality of a current sensor in a short period and with high precision.

According to one aspect of the present invention, a power supply apparatus includes: a power supply; a drive circuit supplied with electric power from the power supply to drive a load circuit; a first current sensor detecting a drive current passing through the drive circuit to output a first current detect value; a second current sensor detecting the drive current to output a second current detect value; a control circuit controlling the drive circuit so that the first current detect value agrees with a current specify value for the drive current; and a current sensor abnormality detecting circuit detecting the first current detect value being in a predetermined prescribed range and a current difference between the first current detect value and the second current detect value exceeding a prescribed threshold value continuously for a prescribed period, to thereby detect an abnormality of the first current sensor.

Preferably, the power supply apparatus further includes a switch electrically connecting or disconnecting the power supply and the drive circuit by a make and break operation. When the current sensor abnormality detecting circuit detects the abnormality of the first current sensor, the current sensor abnormality detecting circuit controls the make and break operation to electrically disconnect the power supply and the drive circuit.

Preferably, the prescribed range is determined in association with a possible range of the first current detect value when the first current sensor is short-circuited to a ground level.

Preferably, the prescribed threshold value is set to be greater than the current difference between the first current detect value and the second current detect value in a normal operation of the power supply apparatus.

Preferably, the prescribed period is set to be shorter than a period wherein the drive current with a current difference corresponding to the prescribed threshold value between the first current detect value continuously passes through the drive circuit until the drive circuit is damaged.

Preferably, the drive circuit includes a power converter converting electric power between the power supply and the load circuit by a switching operation of switching devices. The current sensor abnormality detecting circuit detects the first current detect value being in the predetermined prescribed range and the current difference between the first current detect value and the second current detect value exceeding the prescribed threshold value continuously for a period shorter than the prescribed period, and lowers a switching frequency of the switching devices.

Preferably, the current sensor abnormality detecting circuit includes: a current detector detecting respective maximum values of the first and second current detect values at each prescribed operation cycle; and an abnormality determiner determining, at each prescribed operation cycle, whether the maximum value of the first current detect value is in the prescribed range and whether a current difference between the maximum value of the first current detect value and the maximum value of the second current detect value exceeds the prescribed threshold value, and detecting, at each of n-successive operation cycles (wherein n is a natural number of at least 2), that the maximum value of the first current detect value is in the predetermined prescribed range and that the current difference between the maximum value of the first current detect value and the maximum value of the second current detect value exceeds the prescribed threshold value, to thereby determine an abnormality of the first current sensor.

Preferably, the load circuit includes an AC motor. The abnormality determiner detects, at each of m-successive operation cycles (wherein m is a natural number of at most n), that the maximum value of the first current detect value is in the prescribed range and that the current difference between the maximum value of the first current detect value and the maximum value of the second current detect value exceeds the prescribed threshold value, and lowers a carrier frequency for controlling the AC motor.

Preferably, the abnormality determiner includes a counter. At each operation cycle, the counter increments a count value if it is determined that the maximum value of the first current detect value is in the prescribed range and the current difference between the maximum value of the first current detect value and the maximum value of the second current detect value exceeds the prescribed threshold value, and initializes the count value if it is determined that the maximum value of the first current detect value is not in the predetermined prescribed range or the current difference between the maximum value of the first current detect value and the maximum value of the second current detect value does not exceed the prescribed threshold value. The abnormality determiner detects the count value reaching a count value equivalent to the n to determine an abnormality of the drive current.

Preferably, the abnormality determiner adjusts the n in accordance with the prescribed threshold value.

Preferably, the abnormality determiner adjusts the n to be relatively smaller as the prescribed threshold value is relatively higher.

Preferably, the current sensor abnormality detecting circuit further includes a temperature detector detecting temperature of a circuit element of the drive circuit. The abnormality determiner adjust the n in accordance with the detected temperature of the circuit element.

Preferably, the abnormality determiner adjusts the n to be relatively smaller as the detected temperature of the circuit element is relatively higher.

Preferably, the operation cycle is longer than a fastest operation cycle at which the current sensor abnormality detecting circuit can operate.

Preferably, the current detector samples the first and second current detect values at the fastest operation cycle, and extracts and holds respective maximum values of the first and second current detect values at each operation cycle.

According to the present invention, since an abnormality of the first current sensor is detected based on the first current detect value used for controlling the drive circuit and the current difference between the first current detect value and the second current detect value, the abnormality can be detected in a shorter period relative to a conventional abnormality detecting apparatus that detects an abnormality of a motor output system based on a deviation between a current specify value and an actual current. As the abnormality of the first current sensor invites damage of the drive circuit by an overcurrent, it must be detected more quickly than an abnormality of the second current sensor. However, an abnormality detection based solely on the current difference between the current detect values cannot satisfy this requirement. According to the present invention, the abnormality of the first current sensor can be detected quickly.

Further, with the configuration of detecting the abnormality of the first current sensor to electrically separate the power supply and the drive circuit, the load placed on the drive circuit when an abnormality occurs can be reduced and the drive circuit can be protected.

In particular, since an overcurrent passes through the drive circuit when the first current sensor is short-circuited to the ground level, quick detection of the abnormality of the first current sensor prevents damage of the drive circuit.

Further, employing as the abnormality determination reference the current difference between the first and second current specify values exceeding a prescribed threshold value that is greater than a current difference in a normal operation, the abnormality not preferable to the drive circuit can be detected with high precision.

Still further, by setting the prescribed period that corresponds to an abnormality determining period to a range with which the drive circuit can withstand the abnormal drive current, the drive circuit can be protected while high detection precision is maintained.

Still further, by lowering the switching frequency during the prescribed period, the high detection precision can be maintained while the load placed on the drive circuit is further reduced to surely protect the drive circuit.

By correlating the prescribed threshold value for determining the abnormality of the first current sensor and the prescribed period, the load placed on the drive circuit when an abnormality occurs can be reduced while the detection precision can be maintained.

Further, by detecting the drive current at the fastest operation cycle of the CPU and by determining the abnormality at a longer operation cycle than the fastest operation cycle, the processing time of the CPU can effectively used, and an abnormality determining system with high precision can be structured with an inexpensive CPU.

BEST MODES FOR CARRYING OUT THE INVENTION

Figure 1:
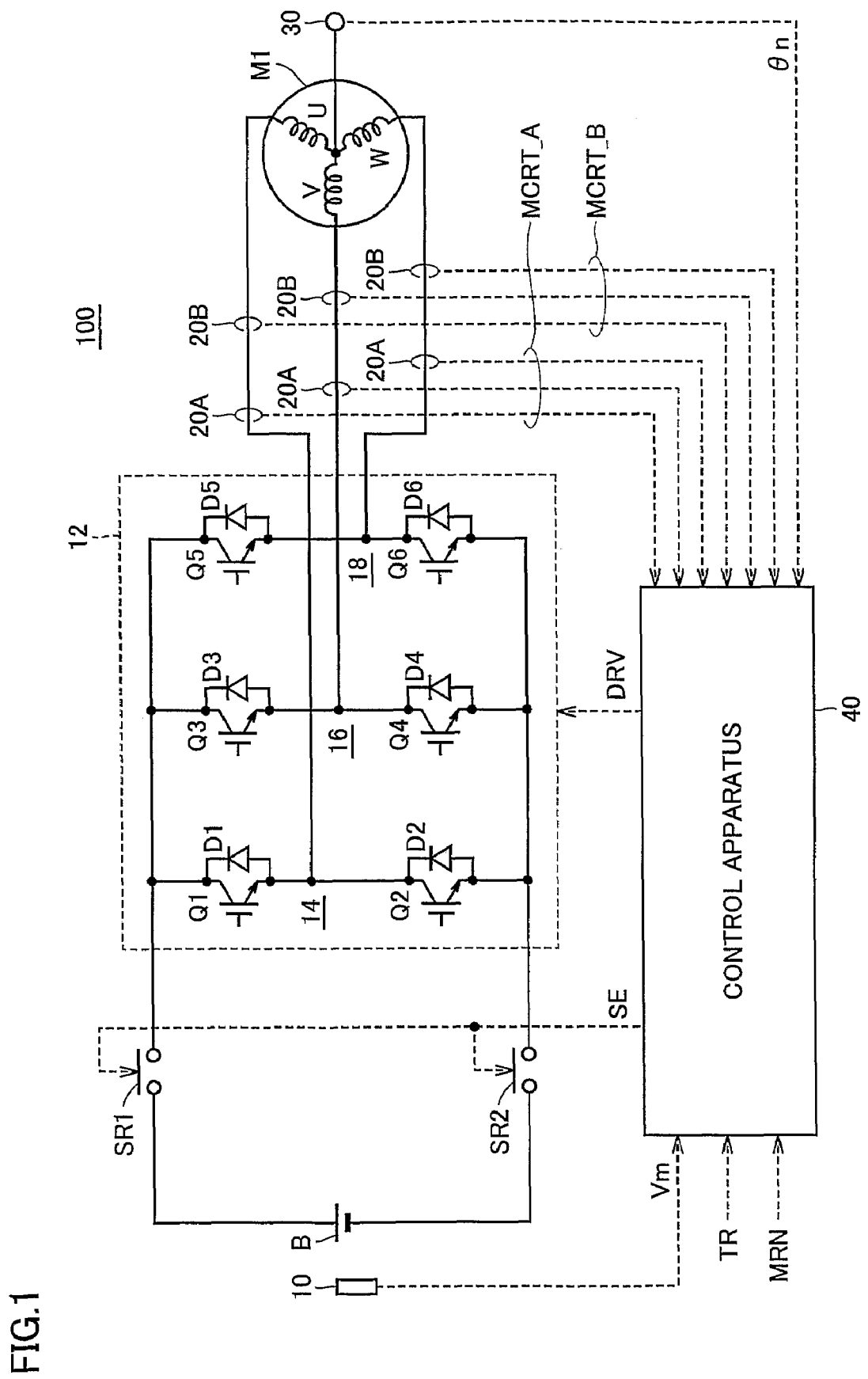
FIG. 1 is a schematic block diagram of a power supply apparatus according to a first embodiment of the present invention.

In the following, referring to the drawings, embodiments of the present invention will be described in detail. In the drawings, the identical or corresponding parts are denoted by identical reference characters.

FIRST EMBODIMENT

FIG. 1 is a schematic block diagram of a power supply apparatus according to a first embodiment of the present invention.

Referring to FIG. 1, a power supply apparatus 100 includes a DC (Direct Current) power supply B, system relays SR1 and SR2, a voltage sensor 10, an inverter 12, current sensors 20A and 20B, a resolver 30, and a control apparatus 40.

AC motor M1 is a drive motor for generating torque for driving the driving wheels of a hybrid vehicle or an electric vehicle. AC motor M1 has a function of a generator driven by an engine, and also operates as an electric motor to the engine, e.g., to start the engine.

Inverter 12 is constituted by a U-phase arm 14, a V-phase arm 16 and a W-phase arm 18. U-phase arm 14, V-phase arm 16, and W-phase, arm 18 are provided in parallel between the power supply line and the earth line.

U-phase arm 14 is constituted by serially connected NPN transistors Q1 and Q2. V-phase arm 16 is constituted by serially connected NPN transistors Q3 and Q4. W-phase arm 18 is constituted by serially connected NPN transistors Q5 and Q6. NPN transistors Q1-Q6 are provided with diodes D1-D6, respectively, between respective collectors and emitters, for passing a current from the emitter side to the collector side.

The intermediate point of each phase arm is connected to each phase end of each phase coil of AC motor M1. Specifically, AC motor M1 is a three-phase permanent magnet motor, in which three coils of U, V and W-phases have their one ends connected in common to a neutral point. U-phase coil has its other end connected to the intermediate point between NPN transistors Q1 and Q2, V-phase coil has its other end connected to the intermediate point between NPN transistors Q3 and Q4, and W-phase coil has its other end connected to the intermediate point between NPN transistors Q5 and Q6.

DC battery B is constituted by a secondary battery such as a nickel metal hydride battery or a lithium ion battery. Alternatively, DC battery B may be a fuel cell. Battery sensor 10 detects voltage Vm output from DC power supply B and outputs the detected voltage Vm to control apparatus 40.

System relays SR1 and SR2 are turned on/off by a signal SE from control apparatus 40.

When supplied with DC voltage from DC power supply B, inverter 12 converts the DC voltage into an AC (Alternating Current) voltage based on a drive signal DRV from control apparatus 40 to drive AC motor M1. Thus, AC motor M1 is driven to generate torque specified by torque command value TR.

In regenerative braking of a hybrid vehicle or an electric vehicle incorporating power supply apparatus 100, inverter 12 converts an AC voltage generated by AC motor M1 into a DC voltage based on signal DRV from control apparatus 40, to supply the converted DC voltage to DC power supply B.

As used herein, regenerative braking includes a braking operation involving regeneration of electricity which is caused by the driver of the hybrid or electric vehicle pressing a foot brake, and turning off an accelerator pedal during traveling to thereby cause regeneration of electricity and to decelerate (or to stop accelerating) the vehicle without operating the foot brake.

Current sensor 20A detects a motor current MCRT_A flowing through AC motor M1, and outputs thus detected motor current MCRT_A to control apparatus 40. Current sensor 20B detects a motor current MCRT_B flowing through AC motor M1, and outputs thus detected motor current MCRT_B to control apparatus 40. That is, current sensors 20A and 20B are provided in parallel to the current paths of the motor currents, and detect the motor currents to provide control apparatus 40 with the detection results MCRT_A and MCRT_B, respectively.

Control apparatus 40 generates drive signal DRV based on motor current MCRT_A from current sensor 20A, as described later, and controls inverter 12 by thus generated drive signal DRV. That is, current sensor 20A constitutes a controlling current sensor that detects motor current MCRT_A to be used in controlling inverter 12. Here, if current sensor 20A that is a controlling current sensor is abnormal, the accuracy of motor current MCRT_A is lost, whereby control of inverter 12 exerted by control apparatus 40 is lost. In particular, if a motor current oscillates to the high current side, inverter 12 receives an excessive load and damaged. Therefore, in power supply apparatus 100 according to the present invention, control apparatus 40 further compares motor current MCRT_A with motor current MCRT_B from current sensor 20B, to detect an abnormality of current sensor 20A based on the difference between the currents. That is, current sensor 20B constitutes a monitoring current sensor to be used in detecting an abnormality of current sensor 20A for maintaining the accuracy of motor current MCRT_A. As power supply apparatus 100 includes both the controlling current sensor and the monitoring current sensor as current sensors for detecting the motor currents, it can control inverter 12 with high precision and stably output desired torque from AC motor M1.

Resolver 30 is attached to the rotation shaft of AC motor M1, and detects a rotation angle θn of the rotation shaft of AC motor M1 to output it to control apparatus 40.

Control apparatus 40 receives torque command value TR and motor rotation rate MRN from an externally provided ECU (Electrical Control Unit), receives voltage Vm from voltage sensor 10, receives motor current MCRT_A from current sensor 20A, receives motor current MCRT_B from current sensor 20B, and receives rotation angle θn from resolver 30.

Using rotation angle θn from resolver 30, torque command value TR and motor current MCRT_A, control apparatus 40 generates drive signal DRV for driving NPN transistors Q1-Q6 of inverter 12, and outputs thus generated drive signal DRV to inverter 12.

Further, in regenerative braking of the hybrid or electric vehicle incorporating power supply apparatus 100, control apparatus 40 generates drive signal DRV for converting an AC voltage generated by AC motor M1 into a DC voltage based on rotation angle θn, torque command value TR and motor current MCRT_A, and outputs thus generated drive signal DRV to inverter 12. In this case, NPN transistors Q1-Q6 of inverter 12 are switching-controlled by drive signal DRV. Thus, inverter 12 converts the AC voltage generated by AC motor M1 into the DC voltage to be supplied to DC power supply B.

Control apparatus 40 detects an abnormality of current sensor 20A in accordance with a method described later and based on motor current MCRT_A and motor current MCRT_B. On detecting the abnormality of current sensor 20A, control apparatus 40 turns off system relays SR1 and SR2 and disconnects DC power supply B from power supply apparatus 100, and outputs an alert informing the user of the abnormality from not-shown display means.

Figure 2:
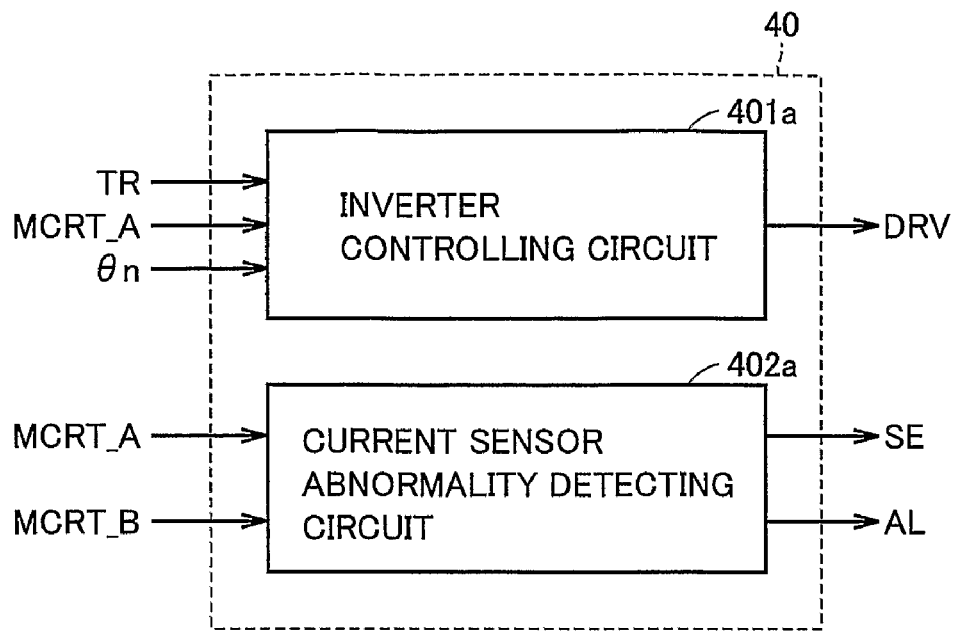
FIG. 2 is a block diagram of a control apparatus in FIG. 1.

FIG. 2 is a block diagram of control apparatus 40 in FIG. 1.

Referring to FIG. 2, control apparatus 40 includes an inverter controlling circuit 401a and a current sensor abnormality detecting circuit 402a.

When AC motor M1 is driving, inverter controlling circuit 401a generates drive signal DRV for turning on/off NPN transistors Q1-Q6 of inverter 12 based on rotation angle θn, torque command value TR and motor current MCRT_A, and outputs thus generated drive signal DRV to inverter 12.

In regenerative braking of the hybrid or electric vehicle incorporating power supply apparatus 100, inverter controlling circuit 401a generates drive signal DRV for converting the AC voltage generated by AC motor M1 into a DC voltage based on rotation angle θn, torque command value TR and motor current MCRT_A, and outputs thus generated drive signal DRV to inverter 12.

Current sensor abnormality detecting circuit 402a samples motor current MCRT_A detected by current sensor 20A. Current sensor abnormality detecting circuit 402a samples motor current MCRT_B detected by current sensor 20B at the same timing as motor current MCRT_A. Then, current sensor abnormality detecting circuit 402a detects the abnormality of current sensor 20A based on the current levels thus sampled. On detecting the abnormality of current sensor 20A, current sensor abnormality detecting circuit 402a generates a signal SE for turning off system relays SR1 and SR2, and outputs thus generated signal SE to system relays SR1 and SR2. Further, current sensor abnormality detecting circuit 402a generates a signal AL for informing the user of the abnormality, and outputs thus generated signal AL to the outside of power supply apparatus 100.

Figure 3:
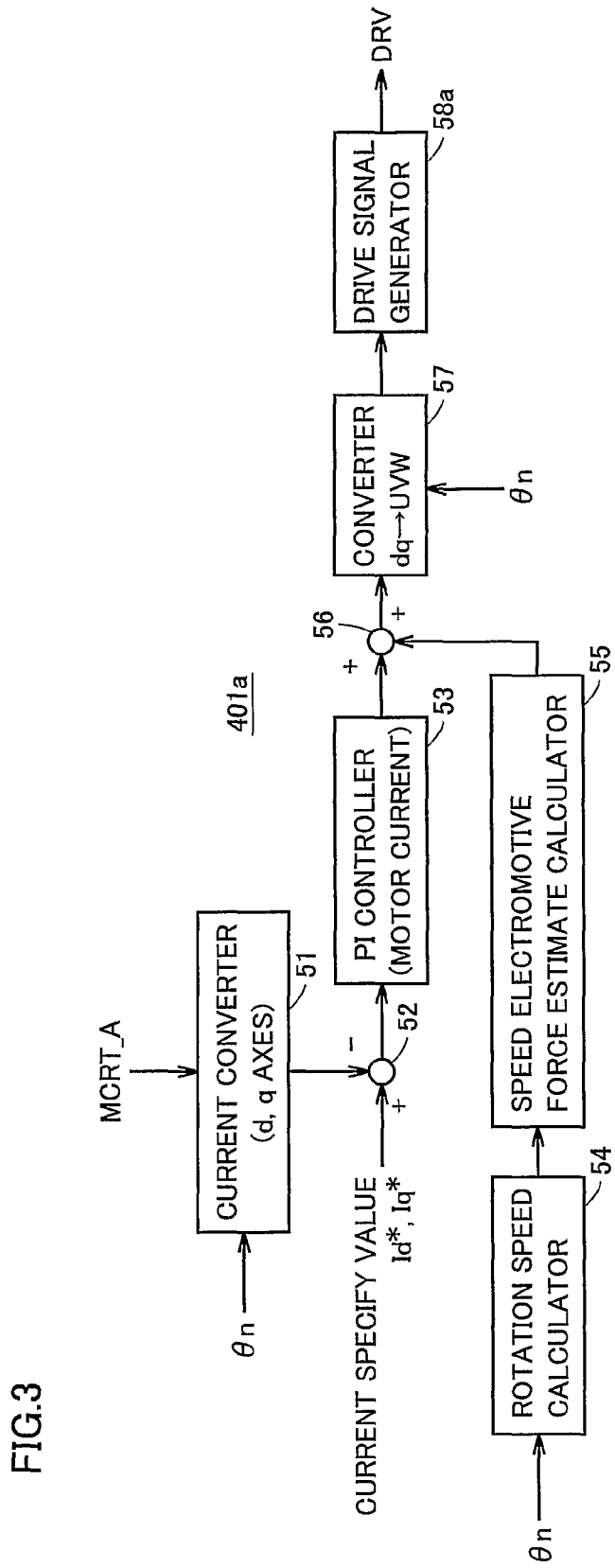
FIG. 3 is a control block diagram of an inverter controlling circuit shown in FIG. 2.

FIG. 3 is a control block diagram of inverter controlling circuit 401a shown in FIG. 2.

Referring to FIG. 3, inverter controlling circuit 401a includes a current converter 51, a subtractor 52, a PI controller 53, a rotation speed calculator 54, a speed electromotive force estimate calculator 55, an adder 56, a converter 57, and a drive signal generator 58a.

Current converter 51 uses rotation angle θn output from resolver 30 to converts motor current MCRT_A detected by current sensor 20A from three-phase to two-phase. That is, current converter 51 uses rotation angle θn to convert three-phase motor current MCRT_A flowing each phase of AC motor M1 into current values Id, Iq flowing through d axis and q axis to be output to subtractor 52.

Subtractor 52 subtracts, from current specify values Id* and Iq* for AC motor M1 to output torque specified by torque command value TR, current values Id and Iq from current converter 51 to calculate deviations ΔId and ΔIq.

PI controller 53 calculates a control input for adjusting the motor current using a PI gain with deviations ΔId and ΔIq.

Rotation speed calculator 54 calculates the rotation speed of AC motor M1 based on rotation angle θn received from resolver 30, and outputs thus calculated rotation speed to electromotive force estimate calculator 55. Electromotive force estimate calculator 55 calculates an estimate value of electromotive force based on the rotation speed from rotation speed calculator 54.

Adder 56 adds the control input for adjusting the motor current from PI controller 53 and the estimate value of electromotive force from electromotive force estimate calculator 55 to calculate control inputs Vd and Vq to voltages to be applied to d axis and q axis.

Converter 57 uses rotation angle θn to convert control inputs Vd and Vq to voltages to be applied to d axis and q axis into control inputs to voltages to be applied to three-phase coil of AC motor M1. Drive signal generator 58a generates drive signal DVR based on the output from converter 57.

Figure 4:
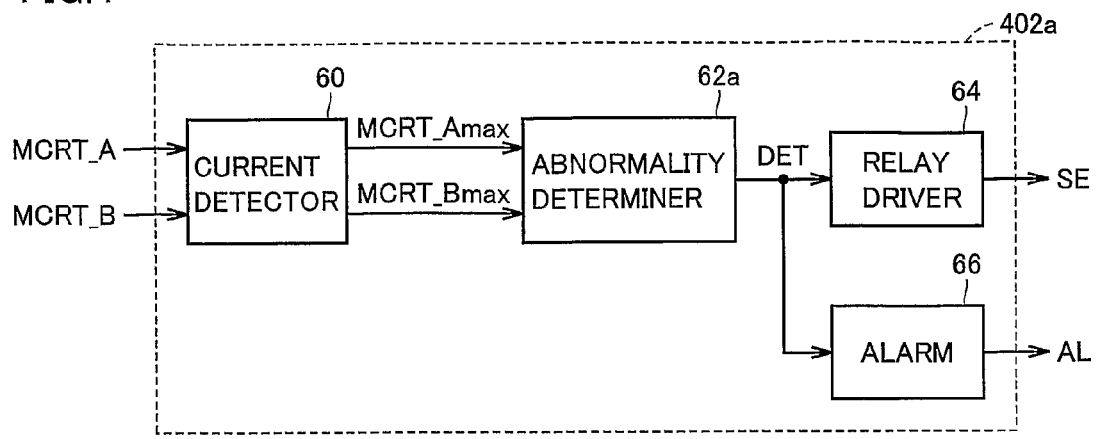
FIG. 4 is a block diagram of a current sensor abnormality detecting circuit shown in FIG. 2.

FIG. 4 is a block diagram of current sensor abnormality detecting circuit 402a shown in FIG. 2.

Referring to FIG. 4, current sensor abnormality detecting circuit 402a includes a current detector 60, an abnormality determiner 62a, a relay driver 64, and an alarm 66.

Current detector 60 receives motor current MCRT_A from current sensor 20A, and receives motor current MCRT_B from current sensor 20B. Current detector 60 samples motor currents MCRT at a prescribed operation cycle (hereinafter also referred to as a first operation cycle). Here, the first operation cycle can be set arbitrarily by a user. However, considering the precision of detecting an abnormality, it is preferable to set the cycle to the fastest operation cycle attained by the CPU (Central Processing Unit) constituting control apparatus 40.

Further, for the sampled motor currents MCRT_A and MCRT_B, current detector 60 captures and holds, at each prescribed operation cycle (hereinafter also referred to as a second operation cycle) longer than the first operation cycle, maximum values (hereinafter also referred to as motor current maximum values MCRT_Amax, MCRT_Bmax) of motor currents MCRT_A and MCRT_B within the operation cycle.

Here, the second operation cycle corresponds to the operation cycle of an abnormality determine process described later, and it can be set to an arbitral cycle by a user similarly to the first operation cycle. However, in order to minimize the load required by the CPU for determining an abnormality, it is desirable to set to a cycle longer than the fastest operation cycle of CPU. In the present embodiment, it is set to, for example, x[ms] (x>0).

Motor current maximum values MCRT_Amax, MCRT_Bmax held at each second operation cycle are output to abnormality determiner 62a. Abnormality determiner 62a receives motor current maximum values MCRT_Amax, MCRT_Bmax, and determines whether current sensor 20A is abnormal, as based on the magnitude of motor current maximum value MCRT_Amax and the difference between them (=|MCRT_Amax−MCRT_Bmax|), as described hereinafter.

Figure 5:
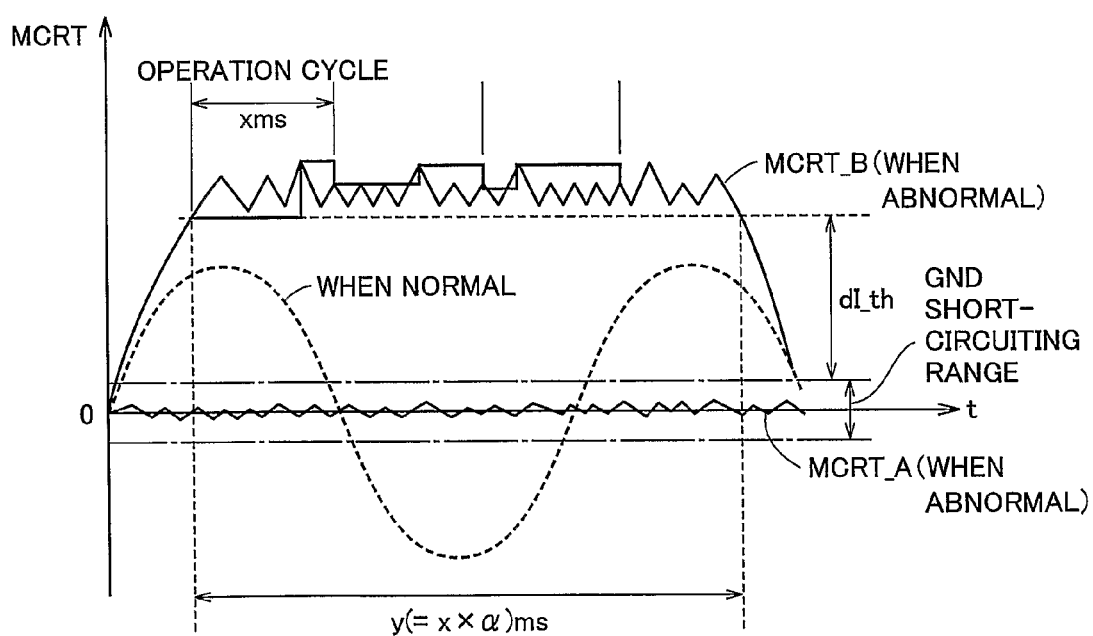
FIG. 5 is a schematic diagram for describing abnormality detecting operation in the current sensor abnormality detecting circuit shown in FIG. 4.

FIG. 5 is a schematic diagram for describing an abnormality detecting operation by a current sensor abnormality detecting circuit 402a shown in FIG. 4.

Referring to FIG. 5, motor currents MCRT_A and MCRT_B appear as a current waveform of sine wave as represented by the dashed line when corresponding current sensors 20A and 20B of power supply apparatus 100 are both in a normal state. On the other hand, if an abnormality of short-circuiting with the ground level (hereinafter also referred to as GND short-circuiting abnormality) occurs in current sensor 20A in power supply apparatus 100, motor current MCRT_A forms a current waveform fixed to a prescribed current range around current value 0 (corresponding to GND short-circuiting range in the drawing) as represented by the solid line.

It is noted that, the prescribed current range is set in advance to cover variations in the sensor output corresponding to the ground level, due to varied electronic components in the ECU, when GND short-circuiting abnormality of current sensor 20A occurs. Further, in current sensor 20A, GND short-circuiting abnormality may occur for example when the harness of current sensor 20A and that of GND line are brought into contact because of damaged coats, or when a terminal of current sensor 20A and GND terminal are brought into conduction because of water leakage.

If GND short-circuiting abnormality of current sensor 20A occurs, problems as described below arise.

Specifically, in control apparatus 40, inverter controlling circuit 401a receives motor current MCRT_A fixed within GND short-circuiting range and converts it into current values Id and Iq. Then, inverter controlling circuit 401a generates drive signal DRV so that deviations ΔId and ΔIq between the converted current values Id and Iq and current specify values Id* and Iq* provide 0. Here, as current values Id and Iq converted from motor current MCRT_A provide substantially 0, inverter controlling circuit 401a generates drive signal DRV for increasing current values Id and Iq to desired current specify values Id* and Iq*, and outputs it to inverter 12. However, motor current MCRT_A detected at current sensor 20A which is involved with GND short-circuiting abnormality is still within GND short-circuiting range and does not increase any. Accordingly, inverter controlling circuit 401a further exerts control to increase current values Id and Iq to current specify values Id* and Iq*. As a result, actual motor current MCRT_B detected at current sensor 20B, which is a monitoring current sensor, continues to increase, and forms a current waveform oscillated from a sine wave as represented by the solid line in the drawing. By the motor current MCRT_B continuing to oscillate at the current level higher than the sine wave in a normal state, an overcurrent continuously passes through inverter 12. This places excessively great load on inverter 12, which may damage inverter 12. Accordingly, the GND short-circuiting abnormality of current sensor 20A must be detected as soon as possible, and the operation of inverter 12 must be stopped immediately after the detection.

As to GND short-circuiting abnormality of current sensor 20B, inverter controlling circuit 401a generates drive signal DRV based on motor current MCRT_A in a normal state regardless of motor current MCRT_B being fixed to GND short-circuiting range, and therefore damage of inverter 12 is not immediately invited. Thus, for protection of inverter 12, it is effective to detect an abnormality of current sensor 20A with higher priority.

Figure 6:
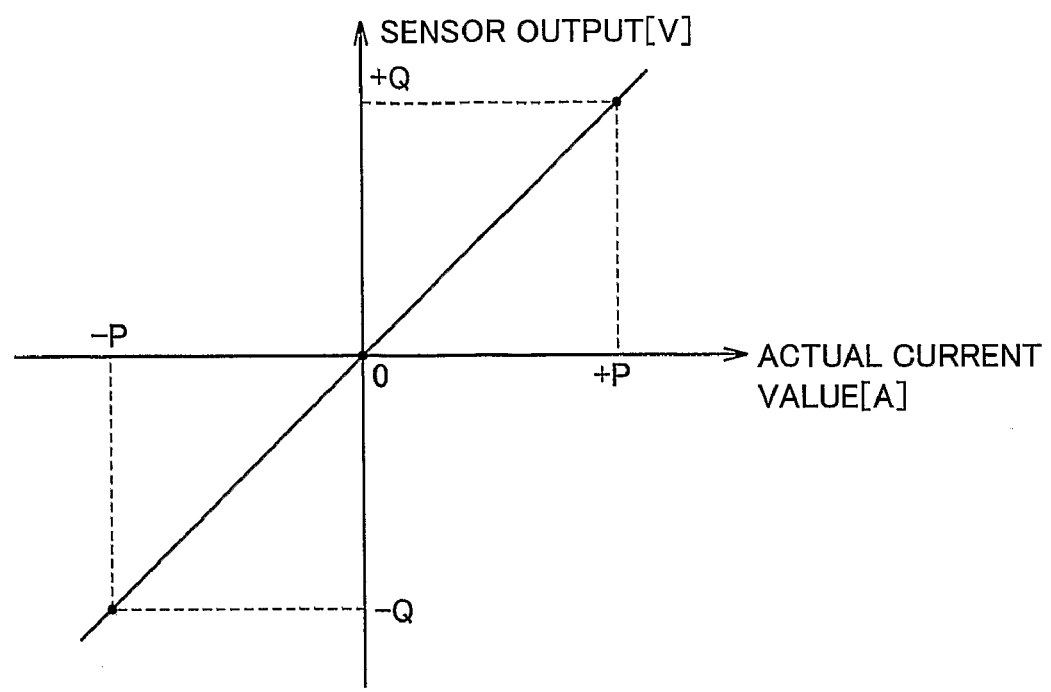
FIG. 6 is a diagram for describing one example of the output characteristics of the current sensor.

However, depending on the configuration of current sensor 20A, GND short-circuiting abnormality is not always readily detected from the output of current sensor 20A. For example, if current sensor 20A has the output characteristics shown in FIG. 6, then with normal current sensor 20A, the sensor output of current sensor 20A shows 0 [V] when the actual current value is 0 [A]. On the other hand, when current sensor 20A is involved with GND short-circuiting abnormality, the sensor output is fixed to substantially 0 [V]. That is, the sensor output shows 0 [V] in both cases where current sensor 20A is normal and motor current MCRT_A shows 0 [A], and where current sensor 10A is involved with GND short-circuiting abnormality. Accordingly, whether current sensor 20A is abnormal cannot be determined as based on the sensor output.

Here, it is assumed that abnormality determiner 62a has a configuration of a conventional abnormality detecting apparatus, where a current difference between motor currents MCRT_A and MCRT_B is determined, and the abnormality of current sensors 20A and 20B is detected based on the relationship in magnitude between the current difference and a prescribed threshold value. With this configuration, the abnormality of one of current sensors 20A and 20B can be detected. However, abnormality detection of current sensor 20A that is essentially necessary cannot be conducted with higher priority. Additionally, the abnormality detection in a short period is difficult, since calculation of the current difference involves a filtering process.

Accordingly, in the present invention, in order to solve the above-described problems and detect the GND short-circuiting abnormality of current sensor 20A in a short period, current sensor abnormality detecting circuit 402a is configured to determine an abnormality of current sensor 20A by detecting motor current MCRT_A being in GND short-circuiting range and the current difference between motor current MCRT_A and motor current MCRT_B continuously exceeding a prescribed threshold value dI_th, as the abnormality detection determination reference.

More specifically, referring to FIG. 5, in the aforementioned current detector 60, motor current maximum values MCRT_Amax and MCRT_Bmax held at each second operation cycle (=x [ms]) are sent to abnormality determiner 62a to first be determined whether motor current maximum value MCRT_Amax is within GND short-circuiting range. Here, if motor current maximum value MCRT_Amax is in GND short-circuiting range, subsequently the relationship in magnitude between the current difference of motor current maximum values MCRT_Amax and MCRT_Bmax and prescribed threshold value dI_th is determined. It is noted that prescribed threshold value dI_th is determined to be sufficiently greater than a current difference that would be resulted between motor currents MCRT_A and MCRT_B due to the variations in characteristics of the sensor outputs when current sensors 20A and 20B are both normal.

Abnormality determiner 62a has a counter circuit therein. When it is determined that the current difference (=|MCRT_Amax−MCRT_Bmax|) is greater than prescribed threshold value dI_th, it increments count value CNT (CNT=CNT+ 1). When it is determined that the current difference is smaller than prescribed threshold value dI_th, it resets count value CNT (CNT=0).

Thus, abnormality determiner 62a determines at each second operation cycle, as to motor current maximum values MCRT_Amax and MCRT_Bmax which are successively input at the second operation cycle, whether motor current maximum value MCRT_Amax is in GND short-circuiting range and as to the relationship in magnitude of the current difference between motor current maximum values MCRT_Amax and MCRT_Bmax and prescribed threshold value dI_th. Then, abnormality determiner 62a increments or resets count value CNT depending on the determination result.

Further, abnormality determiner 62a detects abnormality of current sensor 20A at a timing at which count value CNT exceeds a reference count value α (wherein α is a natural number of at least 2) that is set in advance as the reference of abnormality determination. That is, abnormality determiner 62a detects motor current maximum value MCRT_Amax being within GND short-circuiting range and the current difference exceeding prescribed threshold value dI_th over a period y[ms] corresponding to α-successive second operation cycles (=x [ms]×α) to determine that current sensor 20A is abnormal.

It is noted that, in the present embodiment, abnormality determining period y [ms] corresponding to the product of set reference count value α and second operation cycle x [ms] must be within the range of a period during which inverter 12 can withstand continuously flowing motor current MCRT_B, which has a current difference of prescribed threshold value dI_th between motor current MCRT_A.

With the configuration as above, the abnormality of current sensor 20A is detected as based on the occurrence of abnormality in two or more successive second operation cycles, employing the second operation cycle as one unit for abnormality determination. Therefore, a case where a load on inverter 12 is small, such as when motor current MCRT_B momentarily shows a high current value, is not detected as abnormality. Additionally, as a filter circuit is not used in deriving the current difference between motor currents MCRT_A and MCRT_B, the abnormality of the current sensor can more quickly be detected as compared to a conventional abnormality detecting apparatus. As a result, a high current is prevented from continuously flowing through inverter 12, whereby inverter 12 can be protected from being damaged.

Further, in inverter 12, NPN transistors Q1-Q6 have normally been designed with redundant performance to allow for the excessive load when an abnormality occurs. On the other hand, according to the present invention, as the load is reduced, the apparatus can be structured with the components in the size enough to cover the load in a normal operation. As a result, power supply apparatus 100 can be reduced in size and costs.

In the present invention, reference count value α can be set to have correlation between prescribed threshold value dI_th. Specifically, when prescribed threshold value dI_th is at a low current level, reference count value α is set to relatively greater value. On the other hand, when prescribed threshold value dI_th is at a high current level, reference count value α is set to relatively smaller value.

Thus, an abnormality is determined by detecting the current difference (=|MCRT_Amax−MCRT_Bmax|) exceeding in greater number of times prescribed threshold value dI_th when prescribed threshold value dI_th is low, and therefore erroneous detection can surely be prevented. On the other hand, an abnormality is determined by detecting the current difference exceeding in smaller number of times prescribed threshold value dI_th when prescribed threshold value dI_th is high, and therefore the load due to an overcurrent can be taken off inverter 12.

Reference count value α can also be set to have correlation between the temperature of the circuit element of the drive circuit, other than prescribed threshold value dI_th. In doing so, the circuit element is provided with a temperature sensor to detect the temperature thereof. When the detected temperature is relatively high, the reference count value α is set to a relatively small value. On the other hand, when the detected temperature is relatively low, the reference count value α may be set to a relatively great value. Thus, the circuit element can be protected from damage due to heat by an overcurrent.

Referring to FIG. 4 again, determining that current sensor 20A is abnormal, abnormality determiner 62a generates detect signal DET specifying abnormality detection, and outputs thus generated detect signal DET to each of relay driver 64 and alarm 66.

In response to detect signal DET, relay driver 64 generates signal SE for turning off system relays SR1 and SR2 and outputs to system relays SR1 and SR2. System relays SR1 and SR2 being turned off in response to signal SE separates DC power supply B from power supply apparatus 100, and an abnormality current is prevented from flowing into inverter 12.

Alarm 66 creates signal AL that is an alarm output informing the user of the abnormality, and outputs thus generated signal AL to the outside of power supply apparatus 100. The output signal AL is transferred to not-shown on-board display means, where it is converted into a voice signal or a video signal to be output.

Figure 7:
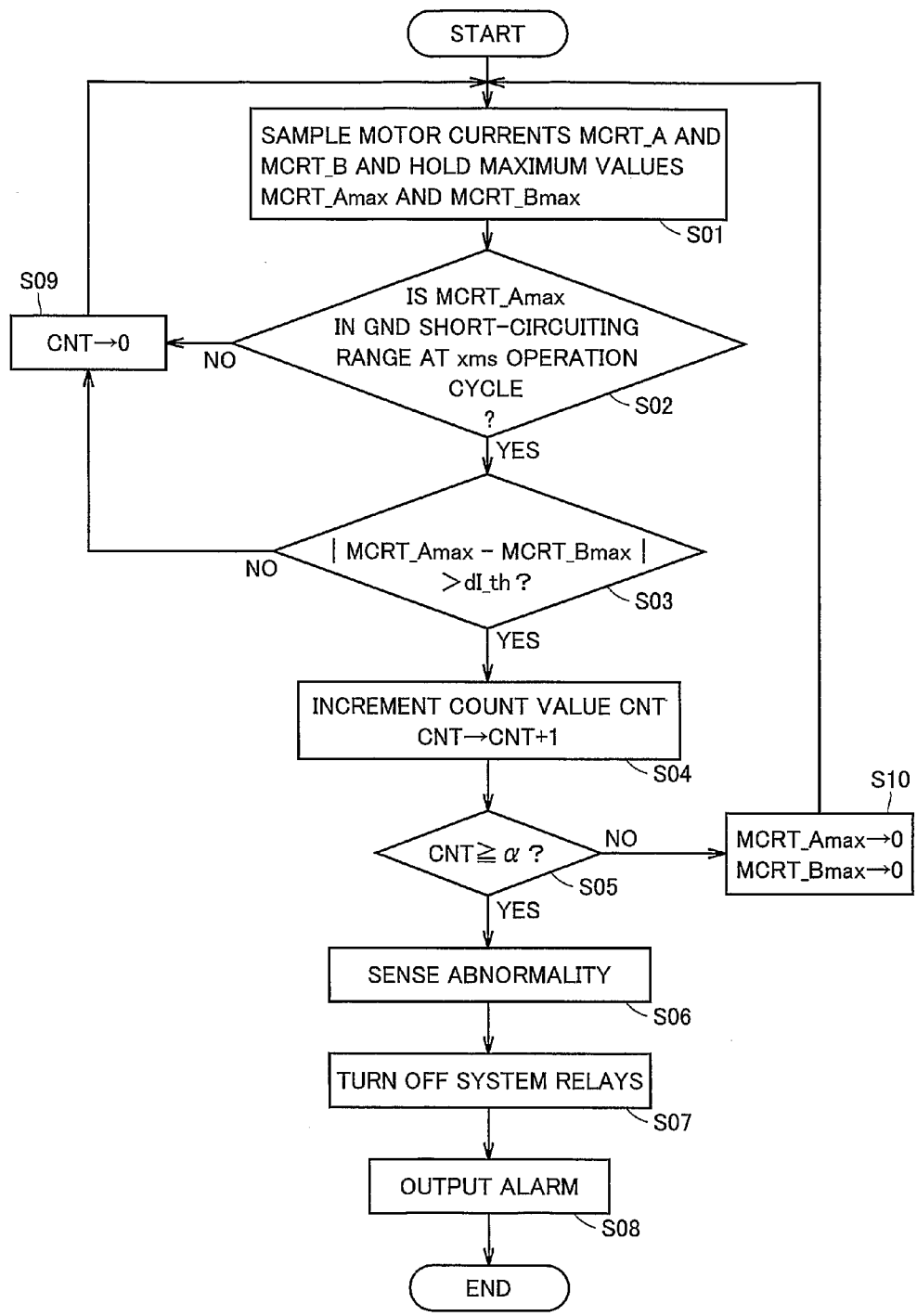
FIG. 7 is a flowchart for describing an operation for detecting a abnormal current of the power supply apparatus according to a first embodiment of the present invention.

FIG. 7 is a flowchart for describing an abnormality current detecting operation of power supply apparatus 100 according to the first embodiment of the present invention.

Referring to FIG. 7, first, current detector 60 first samples motor currents MCRT_A and MCRT_B at a prescribed cycle. Here, the sampling cycle is set to the fastest operation cycle of the CPU as a first operation cycle. Further, current detector 60 extracts motor current maximum values MCRT_Amax and MCRT_Bmax from the current values sampled at each second operation cycle (=x [ms]) and holds them (step S01). The held motor current maximum values MCRT_max are output to abnormality determiner 62a.

Next, abnormality determiner 62a determines whether motor current maximum value MCRT_Amax is within GND short-circuiting range in the second operation cycle (step S02).

In step S02, if it is determined that motor current maximum value MCRT_Amax is within the GND short-circuiting range, abnormality determiner 62a subsequently determines whether a current difference (=|MCRT_Amax−MCRT_Bmax|) is greater than prescribed threshold value dI_th (step S03).

If it is determined that the current difference is greater than prescribed threshold value dI_th in step S03, abnormality determiner 62a increments count value CNT to (CNT+1) (step S04). That is, abnormality determiner 62a determines that motor current maximum value MCRT_Amax is within GND short-circuiting range and that the current difference is greater than prescribed threshold value dI_th, and increments count value CNT.

If it is determined that motor current maximum value MCRT_Amax is not within GND short-circuiting range in step S02, abnormality determiner 62a resets count value CNT (step S09). Abnormality determiner 62a also resets count value CNT when it is determined that the current difference is at most prescribed threshold value dI_th in step S03.

Abnormality determiner 62a performs determinations and count operations of steps S02-S04 and S09 as to motor current maximum values MCRT_Amax and MCRT_Bmax provided at each second operation cycle. Further, abnormality determiner 62a determines whether count value CNT reaches reference count value α each time it increments count value CNT in step S04 (step S05).

Here, if it is determined that count value CNT reaches reference count value α, abnormality determiner 62a generates detect signal DET specifying that an abnormality of current sensor 20A is detected, and outputs thus generated detect signal DET to relay driver 64 and alarm 66 (step S06).

Relay driver 64 receives detect signal DET and generates signal SE for turning off system relays SR1 and SR2, and outputs it to system relays SR1 and SR2. Thus, system relays SR1 and SR2 are turned off (step S07).

Alarm 66 receives detect signal DET, and generates signal AL to be output to display means (not shown) arranged outside power supply apparatus 100. Thus, the user is informed of the occurrence of an abnormal current (step S08).

If it is determined that count value CNT does not reach reference count value α in step S05, that is, when the current difference does not exceed prescribed threshold value dI_th successively for α-successive second operation cycles, motor current maximum values MCRT_Amax and MCRT_Bmax are both reset (MCRT_Amax=0, MCRT_Bmax=0) as shown in step S10, and the process goes back to step SO1 to detect motor currents MCRT_A and MCRT_B again.

In the present invention, current sensor 20A that is a controlling current sensor constitutes "a first current sensor", while current sensor 20B that is a monitoring current sensor constitutes "a second current sensor".

Motor current MCRT_A constitutes "a first current detect value", while motor current MCRT_B constitutes "a second current detect value".

As above, according to the first embodiment of the present invention, an abnormality of a controlling current sensor can be detected in a short period, and an inverter can be protected from an overcurrent that is generated when an abnormality occurs.

By correlating a prescribed threshold value to be the reference of determining an abnormality of a controlling current sensor and a reference count value, the detection precision can be maintained and the load on the inverter when an abnormality occurs can be reduced.

Further, as the motor currents are detected at the fastest operation cycle of the CPU and the abnormality determination is performed at the operation cycle of at most the fastest operation cycle, the processing time of the CPU can effectively be used and an abnormality determination system with high precision can be configured with an inexpensive CPU.

SECOND EMBODIMENT

Figure 8:
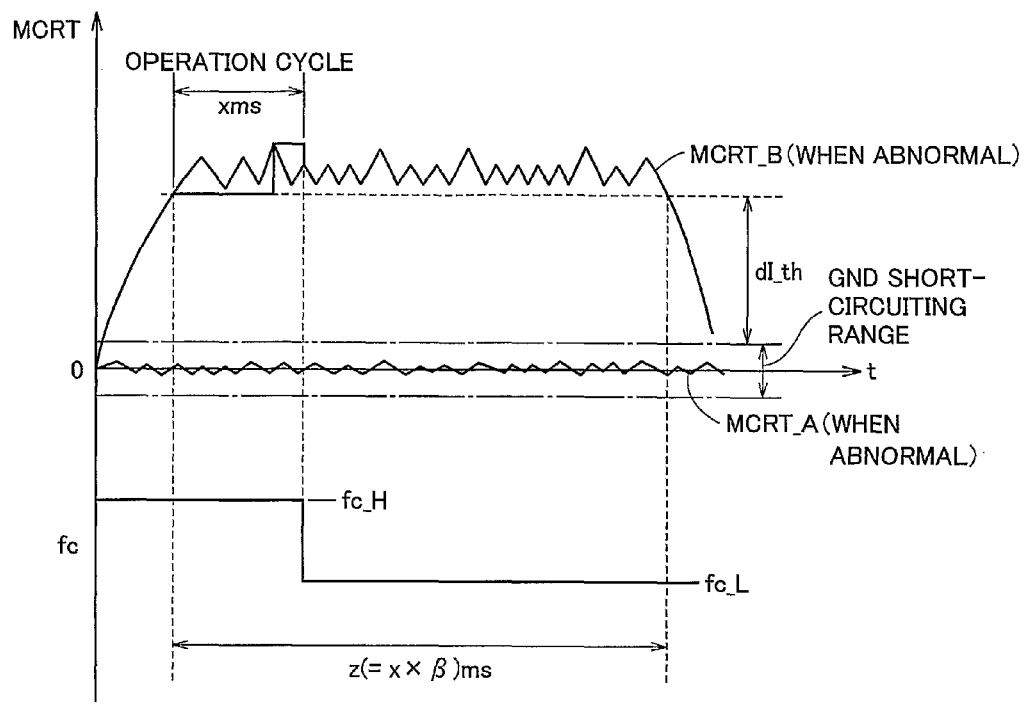
FIG. 8 is a schematic diagram for describing an abnormality detecting operation according to a second embodiment of the present invention.

FIG. 8 is a schematic diagram for describing an abnormality detecting operation according to a second embodiment of the present invention.

Referring to FIG. 8, when current sensor 20A is involved with GND short-circuiting abnormality in power supply apparatus 100, motor current MCRT_A forms a current waveform fixed to the GND short-circuiting range as indicated by the solid line. Affected by motor current MCRT_A, motor current MCRT_B forms a current waveform oscillating at a current level higher than a sine wave in a normal state. Details of the current waveforms are as described above with reference to FIG. 5.

Here, as described above, GND short-circuiting abnormality of current sensor 20A must be detected in a short period, since high motor current MCRT_B continuously passing through inverter 12 places excessive load on inverter 12. On the other hand, if the abnormality determining period is reduced further, motor current MCRT_B with a temporary high current level may erroneously be determined as an abnormality of current sensor 20A. Hence, the abnormality determining period is preferably shorter in a range not impairing the detection precision.

Accordingly, in the present embodiment, in order to maintain high detection precision while further reducing the load on inverter 12, a configuration is employed wherein the frequency (a switching frequency) for turning on/off NPN transistors Q1-Q6 of inverter 12 is lowered during an abnormality determining period.

Specifically, when the control mode of AC motor M1 in inverter 12 is PWM (Pulse Width Modulation) control mode, with different carrier frequency fc, motor currents MCRT_A and MCRT_B have different current waveform. Accordingly, in case of current sensor 20A being abnormal also, the magnitude of a load placed on inverter 12 is different depending on carrier frequency fc. Specifically, the load on inverter 12 is greater as carrier frequency fc is higher.

Accordingly, by lowering carrier frequency fc in response to a lapse of a period shorter than a preset abnormality determining period, the load on inverter 12 is reduced in a period following that timing. Thus, the abnormality of current sensor 20A can be detected with high precision while providing further protection of inverter 12.

More specifically, the timing to lower carrier frequency fc is set as follows. For example as shown in FIG. 8, in a first second operation cycle, if it is determined that motor current maximum value MCRT_Amax is within GND short-circuiting range and a current difference (=|MCRT_Amax−MCRT_Bmax|) is greater than prescribed threshold value dI_th, then in the following second operation cycle, carrier frequency fc is lowered from fc_H to fc_L. Then, an abnormality of current sensor 20A is determined when the above determination result is successively obtained for (β−1) second operation cycles (wherein β is a natural number of at least 2).

It is noted that, the abnormality determining period z [ms] (x=[ms]×β) can be set to an arbitrary period based on the level of the lowered carrier frequency fc_L. Specifically, if carrier frequency fc_L is relatively low, abnormality determining period z [ms] is set to a relatively long period. On the other hand, if carrier frequency fc_L is relatively high, abnormality determining period z [ms] is set to a relatively short period.

Figure 9:
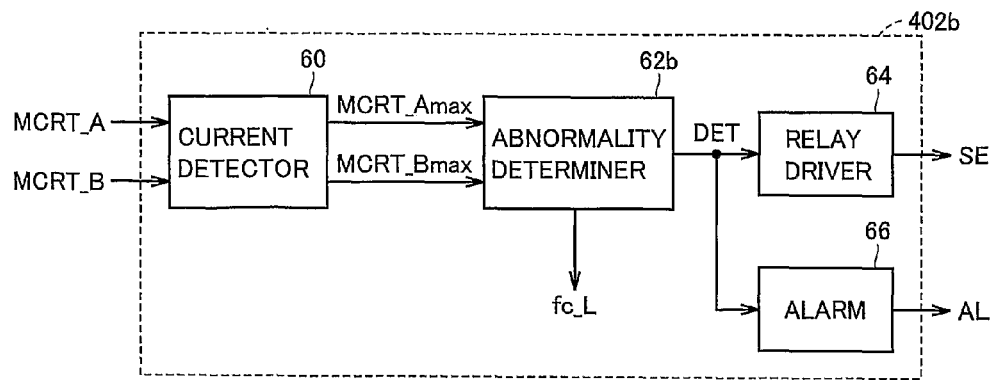
FIG. 9 is a control block diagram of a current sensor abnormality detecting circuit according to the second embodiment of the present invention.

FIG. 9 is a block diagram of a current sensor abnormality detecting circuit in the power supply apparatus according to the second embodiment of the present invention. The power supply apparatus according to the present embodiment is equivalent to power supply apparatus 100 shown in FIG. 1 of which current sensor abnormality detecting circuit 402a is replaced by a current sensor abnormality detecting circuit 402b. Accordingly, detailed description as to the common components is not repeated.

Referring to FIG. 9, current sensor abnormality detecting circuit 402b includes a current detector 60, an abnormality determiner 62b, a relay driver 64 and an alarm 66.

Similarly to the first embodiment, current detector 60 samples motor currents MCRT_A and MCRT_B at a first operation cycle corresponding to the fastest operation cycle of the CPU. For the sampled motor currents MCRT_A and MCRT_B, current detector 60 further captures and holds, at each second operation cycle that is longer than the first operation cycle, motor current maximum values MCRT_Amax and MCRT_Bmax within the operation cycle.

Motor current maximum values MCRT_Amax, MCRT_Bmax held at each second operation cycle are output to abnormality determiner 62b. Abnormality determiner 62b receives motor current maximum values MCRT_Amax, MCRT_Bmax, and determines whether current sensor 20A is abnormal, as based on the magnitude of motor current maximum value MCRT_Amax and the difference between them (=|MCRT_Amax−MCRT_Bmax|).

Here, similarly to the above abnormality determiner 62a, abnormality determiner 62b determines at each second operation cycle whether motor current maximum value MCRT_Amax is within GND short-circuiting range, and as to the relationship in magnitude between the current difference of motor current maximum values MCRT_Amax and MCRT_Bmax and prescribed threshold value dI_th. Then, abnormality determiner 62b increments or resets count value CNT depending on the determination result.

When count value CNT is incremented in a first second operation cycle, abnormality determiner 62b lowers carrier frequency fc from carrier frequency fc_H to lower carrier frequency fc_L in the following second operation cycle. Here, abnormality determiner 62b outputs the lowered carrier frequency fc_L to inverter controlling circuit 401b shown in FIG. 10.

Figure 10:
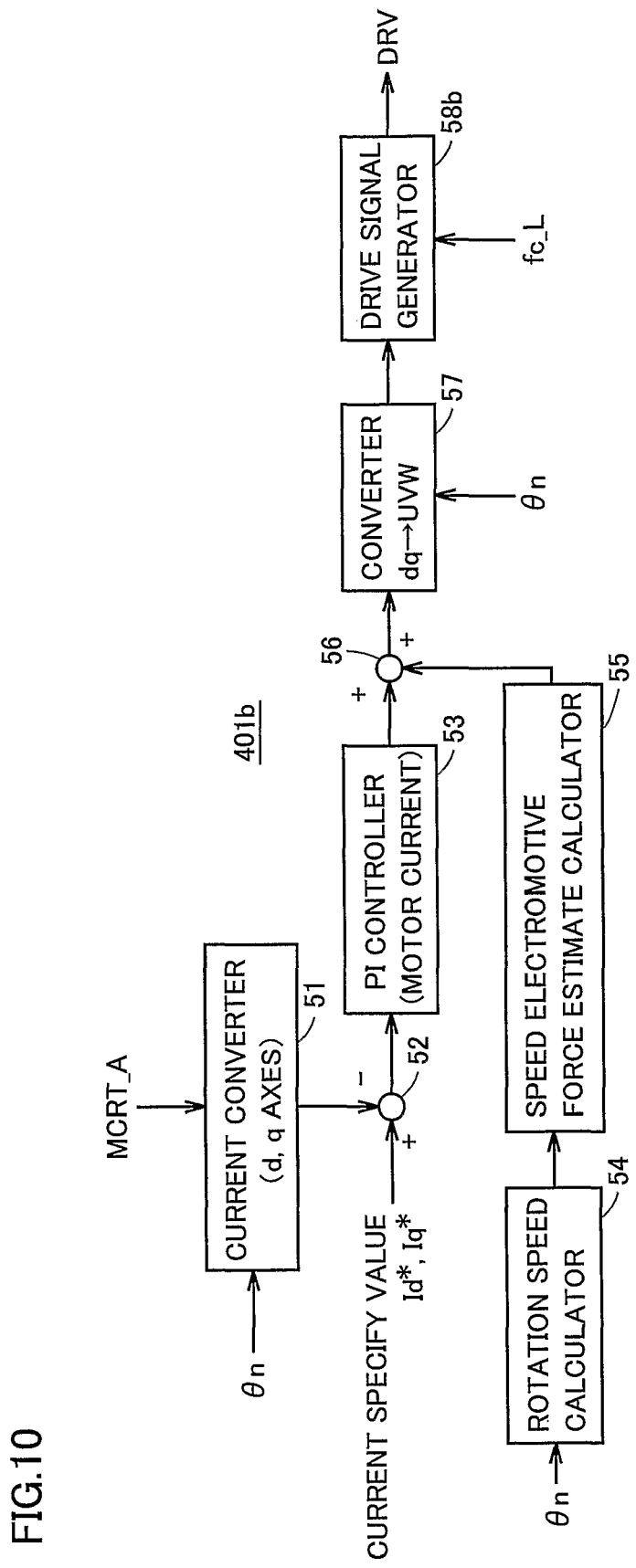
FIG. 10 is a control block diagram of an inverter controlling circuit according to the second embodiment of the present invention.

FIG. 10 is a control block diagram of inverter controlling circuit 401b according to the second embodiment of the present invention.

Referring to FIG. 10, inverter controlling circuit 401b corresponds to inverter controlling circuit 401 shown in FIG. 3 of which drive signal generator 58a is replaced by drive signal generator 58b.

Drive signal generator 58b receives the lowered carrier frequency fc_L from abnormality determiner 62b, and uses the same to generate drive signal DRV for switching-control NPN transistors Q1-Q6 of inverter 12. Then, drive signal generator 58b outputs thus generated drive signal DRV to inverter 12. Thus, inverter 12 drives AC motor M1 with the lowered carrier frequency fc_L.

Referring to FIG. 9 again, after carrier frequency fc is lowered, abnormality determiner 62b detects an abnormality of current sensor 20A at a timing where count value CNT exceeds reference count value β preset as a reference of abnormality determination. Specifically, abnormality determiner 62b detects motor current maximum value MCRT_Amax being within the GND short-circuiting range and the current difference exceeding prescribed threshold value dI_th over a period z [ms] corresponding to successive β second operation cycles (=x [ms]×β) to determine that current sensor 20A is abnormal.

Figure 11:
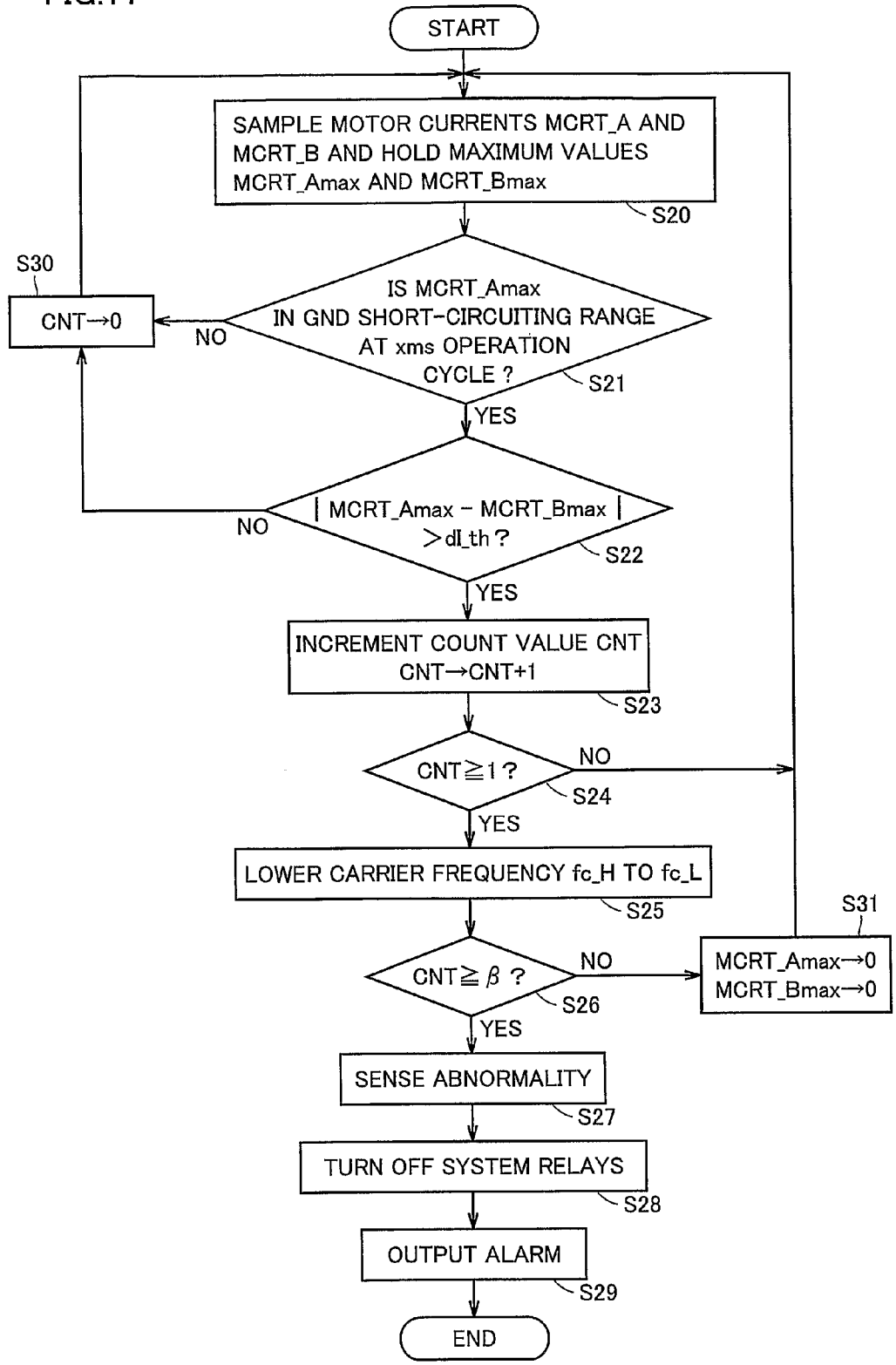
FIG. 11 is a flowchart for describing a abnormal current detecting operation of a power supply apparatus according to the second embodiment of the present invention.
Figure 12:
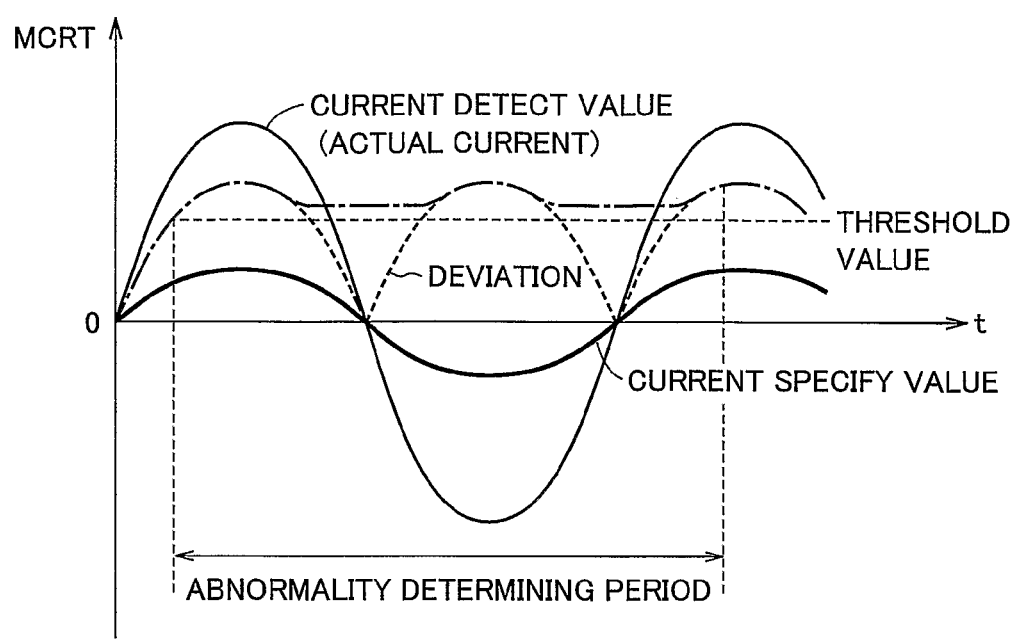
FIG. 12 is a diagram for describing current compare means in a conventional apparatus for detecting an abnormality of a motor output system.

FIG. 11 is a flowchart for describing an abnormal current detecting operation of power supply apparatus 100 according to the second embodiment of the present invention.

Referring to FIG. 11, first, current detector 60 samples motor currents MCRT_A and MCRT_B at a prescribed cycle. Here, the sampling cycle is set to the CPU's fastest operation cycle as a first operation cycle. Further, current detector 60 extracts and holds motor current maximum values MCRT_Amax and MCRT_Bmax from the current values sampled at each second operation cycle (=x [ms]) (step S20). The held motor current maximum values MCRT_max are output to abnormality determiner 62b.

Next, abnormality determiner 62b determines whether motor current maximum value MCRT_Amax is within GND short-circuiting range in the second operation cycle (step S21).

In step S21, if it is determined that motor current maximum value MCRT_Amax is within the GND short-circuiting range, abnormality determiner 62b subsequently determines whether a current difference (=|MCRT_Amax−MCRT_Bmax|) is greater than prescribed threshold value dI_th (step S22).

Then, if it is determined that the current difference is greater than prescribed threshold value dI_th in step 22, abnormality determiner 62b increments count value CNT to (CNT+1) (step S23). That is, abnormality determiner 62b determines that motor current maximum value MCRT_Amax is within GND short-circuiting range and that the current difference is greater than prescribed threshold value dI_th, and increments count value CNT.

On the other hand, if it is determined that motor current maximum value MCRT_Amax is not within GND short-circuiting range in step S21, abnormality determiner 62b resets count value CNT (step S30). Abnormality determiner 62b also resets count value CNT when it is determined that the current difference is at most prescribed threshold value dI_th in step S22.

Abnormality determiner 62b performs determinations and count operations of steps S20-S23 and S30 as to motor current maximum values MCRT_Amax and MCRT_Bmax provided at each second operation cycle. Here, if count value CNT is incremented in step S23, abnormality determiner 62b determines whether count value CNT reaches a prescribed count value (for example, CNT=1) corresponding to a period shorter than a preset abnormality determining period (step S24).

If it is determined that count value CNT reaches prescribed count value (CNT=1), abnormality determiner 62b lowers carrier frequency fc to lower carrier frequency fc_L (step S25). On the other hand, if it is determined that count value CNT does not reach the prescribed count value, abnormality determiner 62b goes back to step S20 again to detect motor currents MCRT_A and MCRT_B.

Further, after carrier frequency fc is lowered, abnormality determiner 62b determines whether count value CNT reaches reference count value β every time count value CNT is incremented (step S26).

Here, if it is determined that count value CNT reaches reference count value β, abnormality determiner 62b generates detect signal DET specifying the detection of the abnormality of current sensor 20A, and outputs thus generated detect signal DET to relay driver 64 and alarm 66 (step S27).

Relay driver 64 receives detect signal DET, and generates signal SE for turning off system relays SR1 and SR2, and outputs the same to system relays SR1 and SR2. Thus, system relays SR1 and SR2 are turned off (step S28).

Alarm 66 receives detect signal DET, and generates signal AL to be output to display means (not shown) arranged outside power supply apparatus 100. Thus, the user is informed of the occurrence of an abnormal current (step S29).

On the other hand, if it is determined that count value CNT does not reach reference count value β in step S26, that is, if the current difference does not exceed prescribed threshold value dI_th successively for β-successive second operation cycles, motor current maximum values MCRT_Amax and MCRT_Bmax are both reset (MCRT_Amax=0, MCRT_Bmax=0) as shown in step S31, and the process goes back to step S20 to detect motor currents MCRT_A and MCRT_B again.

As above, according to the second embodiment of the present invention, by lowering carrier frequency during an abnormality determining period, the load can be taken off the inverter achieving further protection thereof, and also the abnormality of a controlling current sensor can be detected with high precision.

INDUSTRIAL APPLICABILITY

The present invention is applicable to a power supply apparatus including a drive circuit that is supplied with power from the power supply to drive a load circuit.

The invention claimed is:

1. A power supply apparatus, comprising:
a power supply;
a drive circuit supplied with electric power from said power supply to drive a load circuit;
a first current sensor detecting a drive current passing through said drive circuit to output a first current detect value;
a second current sensor detecting said drive current to output a second current detect value;
a control circuit controlling said drive circuit so that said first current detect value agrees with a current specify value for said drive current; and
a current sensor abnormality detecting circuit detecting said first current detect value being in a predetermined prescribed range and a current difference between said first current detect value and said second current detect value exceeding a prescribed threshold value continuously for a prescribed period, to thereby detect an abnormality of said first current sensor.

2. The power supply apparatus according to claim 1, further comprising
a switch electrically connecting or disconnecting said power supply and said drive circuit by a make and break operation, wherein
when said current sensor abnormality detecting circuit detects the abnormality of said first current sensor, said current sensor abnormality detecting circuit controls the make and break operation to electrically disconnect said power supply and said drive circuit.

3. The power supply apparatus according to claim 2, wherein
said prescribed range is determined in association with a possible range of the first current detect value when said first current sensor is short-circuited to a ground level.

4. The power supply apparatus according to claim 3, wherein
said prescribed threshold value is set to be greater than the current difference between said first current detect value and said second current detect value in a normal operation of said power supply apparatus.

5. The power supply apparatus according to claim 4, wherein
said prescribed period is set to be shorter than a period wherein said drive current with a current difference corresponding to said prescribed threshold value between said first current detect value continuously passes through said drive circuit until said drive circuit is damaged.

6. The power supply apparatus according to claim 1, wherein
said drive circuit includes a power converter converting electric power between said power supply and said load circuit by a switching operation of switching devices,
said current sensor abnormality detecting circuit detecting said first current detect value being in said predetermined prescribed range and the current difference between said first current detect value and said second current detect value exceeding said prescribed threshold value continuously for a period shorter than said prescribed period, and lowers a switching frequency of said switching devices.

7. The power supply apparatus according to claim 1, wherein
said current sensor abnormality detecting circuit includes
a current detector detecting respective maximum values of said first and second current detect values at each prescribed operation cycle, and
an abnormality determiner determining, at each said prescribed operation cycle, whether the maximum value of said first current detect value is in said prescribed range and whether a current difference between the maximum value of said first current detect value and the maximum value of said second current detect value exceeds said prescribed threshold value, and detecting, at each of n-successive said operation cycles (wherein n is a natural number of at least 2), that said maximum value of said first current detect value is in said predetermined prescribed range and that the current difference between the maximum value of said first current detect value and the maximum value of said second current detect value exceeds said prescribed threshold value, to thereby determine an abnormality of said first current sensor.

8. The power supply apparatus according to claim 7, wherein
said load circuit includes an AC motor,
said abnormality determiner detects, at each of m-successive said operation cycles (wherein m is a natural number of at most n), that said maximum value of said first current detect value is in said prescribed range and that the current difference between the maximum value of said first current detect value and the maximum value of said second current detect value exceeds said prescribed threshold value, and lowers a carrier frequency for controlling said AC motor.

9. The power supply apparatus according to claim 7, wherein
said abnormality determiner includes a counter,
at each operation cycle, said counter increments a count value if it is determined that said maximum value of said first current detect value is in said prescribed range and that the current difference between the maximum value of said first current detect value and the maximum value of said second current detect value exceeds said prescribed threshold value, and initializes said count value if it is determined that said maximum value of said first current detect value is not in said predetermined prescribed range or the current difference between the maximum value of said first current detect value and the maximum value of said second current detect value does not exceed said prescribed threshold value, and
said abnormality determiner detects said count value reaching a count value equivalent to said n to determine an abnormality of said drive current.

10. The power supply apparatus according to claim 9, wherein
said abnormality determiner adjusts said n in accordance with said prescribed threshold value.

11. The power supply apparatus according to claim 10, wherein said abnormality determiner adjusts said n to be relatively smaller as said prescribed threshold value is relatively higher.

12. The power supply apparatus according to claim 9, wherein said current sensor abnormality detecting circuit further includes a temperature detector detecting temperature of a circuit element of said drive circuit, and said abnormality determiner adjust said n in accordance with the detected temperature of said circuit element.

13. The power supply apparatus according to claim 12, wherein said abnormality determiner adjusts said n to be relatively smaller as the detected temperature of said circuit element is relatively higher.

14. The power supply apparatus according to claim 7, wherein said operation cycle is longer than a fastest operation cycle at which said current sensor abnormality detecting circuit can operate.

15. The power supply apparatus according to claim 14, wherein said current detector samples said first and second current detect values at said fastest operation cycle, and extracts and holds respective maximum values of said first and second current detect values at each operation cycle.

* * * * *